United States Patent [19]
Norimatsu

[11] Patent Number: 5,101,176
[45] Date of Patent: Mar. 31, 1992

[54] BURST CONTROL CIRCUIT FOR USE IN TDMA COMMUNICATIONS SYSTEM

[75] Inventor: Hidehiko Norimatsu, Tokyo, Japan

[73] Assignee: NEC Corporation, Tokyo, Japan

[21] Appl. No.: 716,474

[22] Filed: Jun. 17, 1991

[30] Foreign Application Priority Data

Jun. 16, 1990 [JP] Japan .................. 2-158241

[51] Int. Cl.[5] .............................................. H03G 3/30
[52] U.S. Cl. .................. 330/279; 330/285; 330/134; 455/126; 375/98
[58] Field of Search ............... 330/279, 285, 127, 129, 330/133, 134; 455/116, 126, 127; 375/60, 98

[56] References Cited

U.S. PATENT DOCUMENTS

| | | | |
|---|---|---|---|
| 4,521,912 | 6/1985 | Franke et al. | 455/126 |
| 4,570,127 | 2/1986 | Tanimoto et al. | 330/279 |
| 4,592,073 | 5/1986 | Watanabe | 375/60 |
| 4,706,262 | 11/1987 | Ohta | 455/116 |

Primary Examiner—Eugene R. LaRoche
Assistant Examiner—Tan Dinh
Attorney, Agent, or Firm—Sughrue, Mion, Zinn, Macpeak & Seas

[57] ABSTRACT

A burst control circuit for use in a TDMA communications system comprises a power amplifier having two separate control terminals. The circuits also comprises an ALC circuit for producing and supplying a level control signal to the first control terminal of the power amplifier to perform negative feedback operation and to keep the level of an output burst signal constant. The burst control circuit further comprises a waveform control circuit which generates in response to a burst timing signal a waveform control signal having gently sloped leading and trailing edges and supplies the waveform control signal to the second control terminal of the power amplifier to control the waveform of the output burst signal.

20 Claims, 2 Drawing Sheets

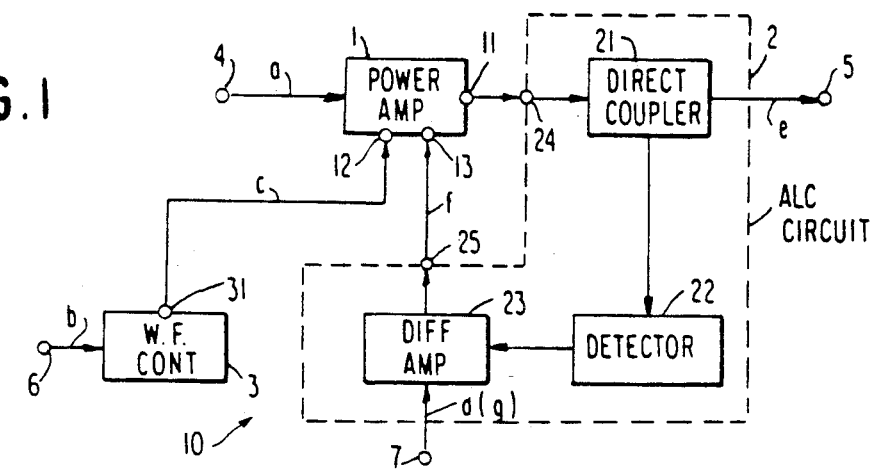
FIG.1
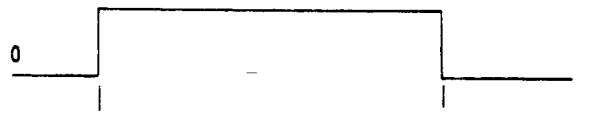
FIG.2A INPUT BURST a
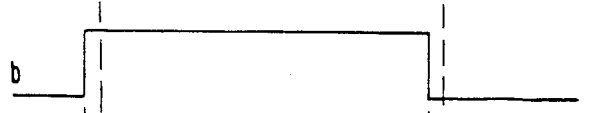
FIG.2B BURST TIMING SIGNAL b
FIG.2C WAVEFORM CONTROL SIGNAL c
FIG.2D REFERENCE VOLTAGE d
FIG.2E OUTPUT BURST e
FIG.2F LEVEL CONTROL SIGNAL f
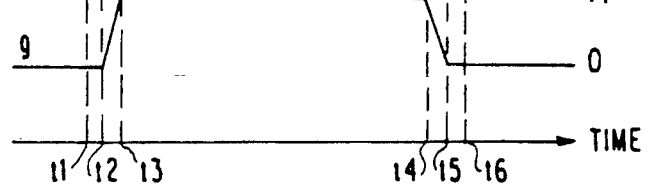
FIG.2G REFERENCE VOLTAGE g

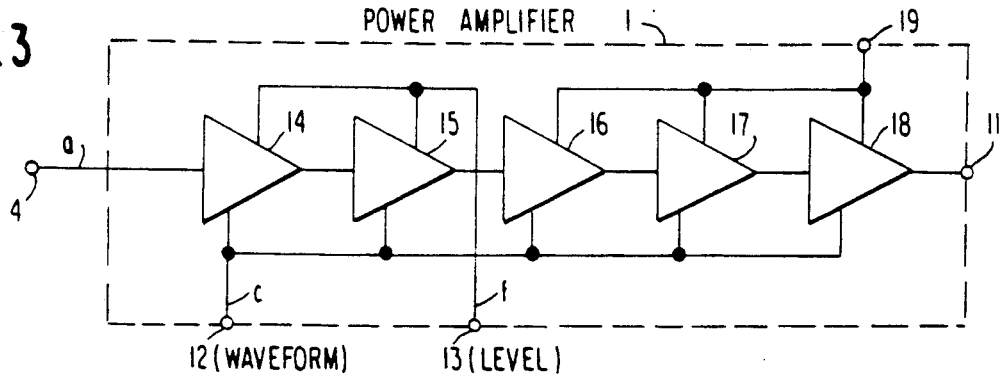
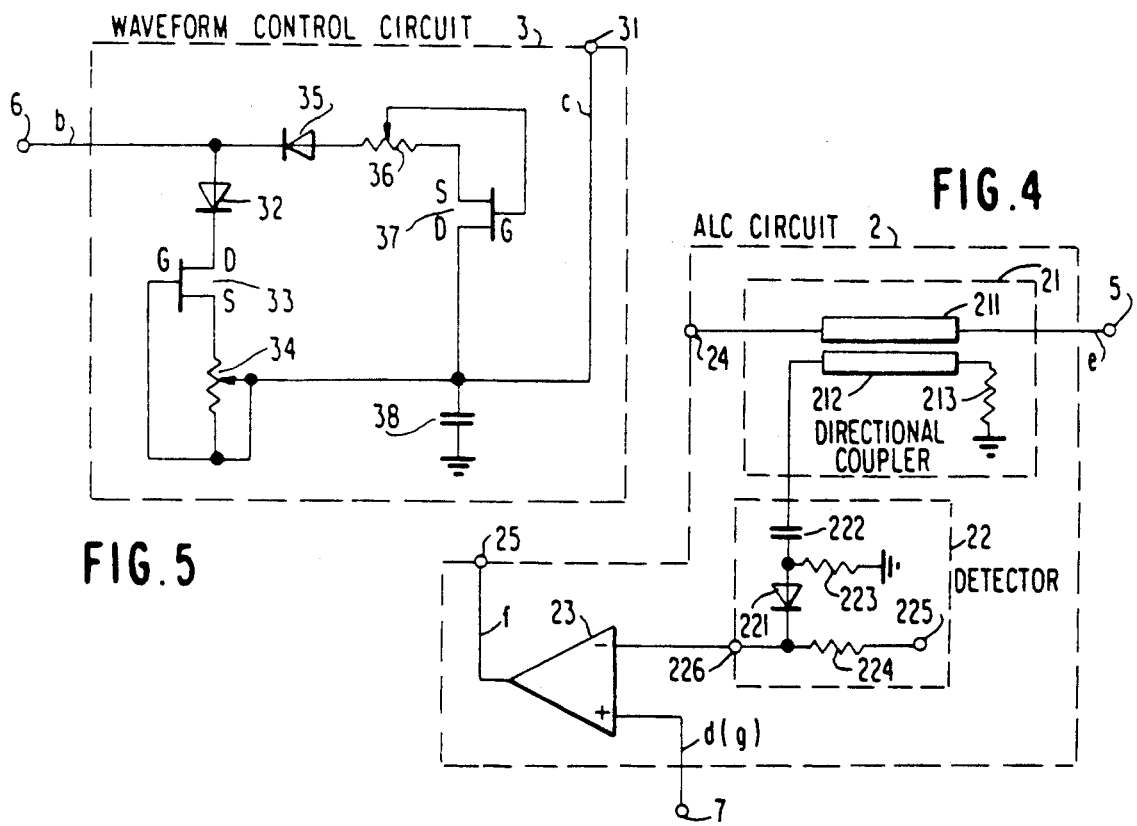
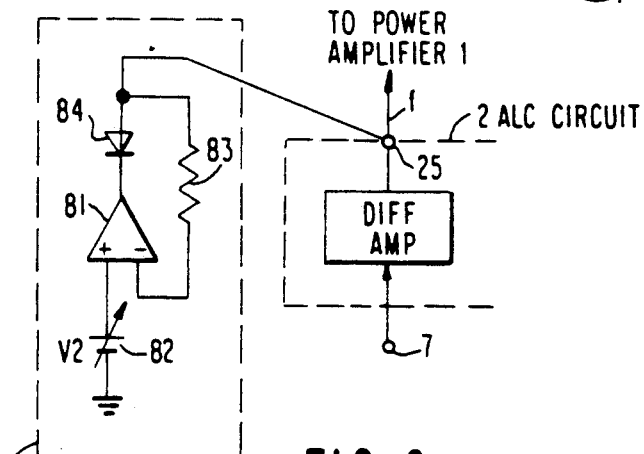

BURST CONTROL CIRCUIT FOR USE IN TDMA COMMUNICATIONS SYSTEM

BACKGROUND OF THE INVENTION

The present invention relates to a burst control circuit for use in a time division multiple access (TDMA) communications system and, more particularly, to a burst control circuit for use in a narrow-band TDMA communications system in which it is required for a carrier wave in a burst form (burst signal) to have not only gently sloped leading and trailing edges but also high-speed rise and fall times.

A conventional burst control circuit is disclosed in a co-pending patent application which claims the priority of the Japanese Patent Application No. 1-166152/89 and corresponds to the U.S. patent application Ser. No. 07/544,431, European Patent Application No. 90112128.5, Canadian Patent Application No. 2,019,935-1 and Australian Patent Application No. 57861/90, and which is assigned to the same assignee as the present application. The disclosed burst control circuit includes a power amplifier preceded by an input level control circuit. A detector circuit detects the output level of the power amplifier to produce a detected signal. The burst control circuit also includes a control signal generator which generates a reference signal having gently sloped leading and trailing edges. The detected and reference signals are voltage compared by a comparator to produce an error signal indicating a voltage difference therebetween. Based on the error signal, two driver circuits control the output levels of the input level circuit and the power amplifier, respectively. By the above-mentioned configuration, the power amplifier produces an output burst signal having gently sloped leading and trailing edges, so that it prevents unnecessary expansion of the spectrum of the output burst signal which may otherwise interfere with other burst signals.

Since the conventional burst control circuit mentioned above controls both the levels of the input level control circuit and the power amplifier, its output burst signal can have an ON/OFF ratio high enough to meet a strict standard, such as a standard set by the Group Special Mobile (GSM) pan-European mobile telephone system. The conventional burst control circuit, however, would not produce an output burst signal having rise and fall times quick enough to meet the standard of, for example, about 20 microseconds required by the GSM system. This can be caused by the slow response speed of a control loop including the input level control circuit, power amplifier, detector circuit, comparator and two driver circuits. The response speed of the control loop may be increased by the use of specially fabricated high-gain comparator and driver circuits. But, this is disadvantageous from the economical viewpoint.

SUMMARY OF THE INVENTION

An object of the present invention is, therefore, to provide a generally improved burst control circuit for use in a TDMA communications system.

Another object of the present invention is to provide a burst control circuit capable of producing an output burst signal having high-speed rise and fall times without resorting to specially fabricated high-gain comparator and driver circuits.

Still another object of the present invention is to provide a burst control circuit capable of producing an output burst signal having a high ON/OFF ratio, which may meet strict standards, such as a GSM standard.

Yet another object of the present invention is to provide a burst control circuit capable of controlling the waveform of an output burst signal with a baseband signal alone.

According to the present invention, there is provided a burst control circuit for use in a TDMA communications system, comprising: power amplifier means having first and second control terminals for amplifying an input burst signal to produce an output burst signal, the amplifier means changing the level and waveform of the output burst signal in response to level and waveform control signals which are supplied through the first and second terminals, respectively; ALC circuit means for generating a level control signal on the basis of a signal representing a difference between a first reference voltage and the level of the output burst signal, and supplying the generated level control signal to the first control terminal as the level control signal; and waveform control circuit means for generating a waveform control signal in response to a burst timing signal, and supplying the generated waveform control signal to the second control terminal as the waveform control signal.

BRIEF DESCRIPTION OF THE DRAWINGS

The above-mentioned and other objects, features and advantages of the present invention will become more apparent from the following detailed description taken in conjunction with the accompanying drawings, in which:

FIG. 1 is a block diagram illustrating a burst control circuit according to a first preferred embodiment of the present invention;

FIGS. 2A-2G show waveforms for explaining the operation of FIG. 1 circuit;

FIG. 3 is a block diagram illustrating the power amplifier in the FIG. 1 circuit;

FIG. 4 is a block diagram illustrating the automatic gain control (ALC) circuit in the FIG. 1 circuit;

FIG. 5 is a block diagram illustrating the waveform control circuit in the FIG. 1 circuit; and FIG. 6 is a block diagram illustrating a burst control circuit according to a second preferred embodiment of the present invention.

DETAILED DESCRIPTION OF THE PREFERRED EMBODIMENTS

In FIG. 1, a burst control circuit 10 comprises a power amplifier 1 to which a burst signal a is applied through an input terminal 4 and from which a waveform- and level-controlled burst signal b is outputted through an automatic level control (ALC) circuit 2 and an output terminal 5. The burst control circuit 10 may be used in a TDMA communications system under the GSM standards in which the carrier frequency of the input burst signal a is in a 950 MHz band, and the duration of same lasts about 600 microseconds, and the rise and fall times of the output burst signal b have to be about 20 microseconds.

The power amplifier 1 has two control terminals 12 and 13 to which a waveform control signal c from a waveform control circuit 3 and a level control signal f from the ALC circuit 2 are applied, respectively. These control signals c and f control the amplification factor of the power amplifier 1 to thereby control the waveform and level of the amplifier's output appearing at a terminal 11. The output thus waveform- and level-controlled is outputted to the output terminal 5 as an output burst signal e through the ALC circuit 2.

The ALC circuit 2 includes a directional coupler 11, for deriving a part of the output burst signal. A detector 22 detects the level of the derived output burst signal to produce and provide a detected burst level to a differential amplifier 23. The differential amplifier 23 is also provided with a reference signal d through a terminal 7 and compares the detected burst level with the voltage V1 of reference signal d. The differential amplifier 23 increases its output when the detected burst level is lower than the reference voltage V1 while decreasing its output when the detected burst level is higher than the reference voltage V1. The output of differential amplifier 13 is supplied to the power amplifier 1 as a level control signal through control terminals 25 and 13. Applying the level control signal to the power amplifier 1 constitutes negative feedback to the amplifier 1. Thus, the output burst signal e has a level determined by the reference voltage V1 and by the circuit constants of the power amplifier 1 and of the ALC circuit 2.

The waveform control circuit 3 generates a waveform control signal c in response to a burst timing signal b. The waveform control signal c has gently sloped leading and trailing edges and is applied to the power amplifier 1 through terminals 31 and 12. Thus, the output burst signal e has gently sloped leading and trailing edges. The periods of the leading and trailing edges, i.e., the rise and fall times of the output burst signal e are determined by those of the waveform control signal c. It should be noted that the timing and duration of the burst timing signal b is usually known in advance at a station in which the burst control circuit 10 is installed.

In the FIG. 1 circuit, since the waveform control signal c passes through no loop circuit, the rise and fall times of the burst signal e can be shortened without resorting to a specially fabricated circuit. Also, since the control signal c is handled in a baseband, it is relatively ease to handle it.

While in FIG. 1 the power amplifier 1 is supposed to have a characteristic that its output level rises with increases in the levels of the control signals c and f inputted to the terminals 12 and 13, the output level of power amplifier 1 may fall with increases in the levels of control signals c and f. In this case, the ALC circuit 2 and the waveform control circuit 3 have to output control signals having the polarities reverse to those of the control signals c and f.

The operation of the embodiment of FIG. 1 will now be described in further detail with reference to FIGS. 2A to 2G. Assume that the input burst signal a (FIG. 2A) whose envelope manifests a rectangular waveform is inputted to the input terminal 4 from time t2 till time t5. The burst timing signal b (FIG. 2B) is supplied to the waveform control circuit 2 through the terminal 6 from t1, ahead of time t2, till time t4, ahead of time t5. The waveform control circuit 2 responds to the inputted burst timing signal b at time t1 to start raising the voltage of waveform control signal c (FIG. 2C) from zero and to continue to raise it until it reaches a voltage Vw at time t3, past time t2. Then, the waveform control circuit 2, after holding the voltage of the waveform control signal c at the constant level Vw, lowers it from time t4 on until it converges to zero volt at time t6, past time t5.

The reference voltage d (FIG. 2D) has a predetermined level V1 and is fed to the ALC circuit 2 from time t2 till time t5. The output level of power amplifier 1 is substantially proportional to the product of the level of level control signal f (FIG. 2F) and the level of the waveform control signal c.

Although it is difficult to definitely define the level of the level control signal f because it is determined by an automatic gain control (AGC) loop including the power amplifier 1 and the ALC circuit 2, the level of the signal e may be regarded as substantially equal during a stable state to the reference voltage V1 of the signal d. Thus, the ON/OFF ratio of output burst signal e can be increased by stopping the reference signal d when no burst signal a is supplied. And, the output burst signal e rises from time t2 to time t3 and falls from time t4 to time t5, and its leading and trailing edges are mainly controlled by the waveform control signal c.

It should be noted that the waveform of the output burst signal e is also affected by the input/output characteristics of the power amplifier 1. Thus, where the power amplifier 1 is, for example, a Class A or Class AB amplifier, even if the level of the level control signal f is zero, the amplifier 1 will still supply a burst signal e of some level even between time t1 and time t2 or between time t5 and time t6 if the waveform control signal c is inputted. It should also be noted that the waveform of the level control signal f should in principle be the same as that of the output burst signal e, but the two waveforms are somewhat different due to the time constant of the ALC circuit 2.

While the level of output burst signal e is substantially proportional to the product of the level control signal f and the waveform control signal c, the ALC circuit 2 would cause the burst signal e to have overshooting at rise or fall times because the ALC circuit 2 has a certain time constant. In order to prevent this overshooting, the reference voltage d may be replaced by a reference voltage g which has inclined leading and trailing edges, as shown in FIG. 2G. More definitely, the reference voltage g rises from zero to V1 between time t2 and time t3, and falls from V1 to zero between time t4 and time t5. This results in reducing the level of level control signal f between time t2 and t3 and between time t4 and time t5, and accordingly the level of output burst signal e falls between these periods to prevent overshooting.

In FIG. 3, the power amplifier 1 comprises five amplifiers 31 through 35 each including an NPN transistor (not shown), connected in cascade between the input terminal 4 and the output terminal 11. The power amplifier 1 may be comprised of an M67769 type power amplifier available from Mitsubishi Electric Corporation, Tokyo, Japan. This power amplifier 1 can amplify an input signal of 2 mW in a 950 MHz frequency band by about 40 dB, by Class AB amplification, to 15 W.

The level control signal f is applied through the terminal 13 to the power source terminals of amplifiers 14 and 15, which terminals may usually include the collectors of NPN transistors therein. By changing the level control signal f, about 30 dB can be controlled at the amplifiers 14 and 15. The waveform control signal c is applied through the terminal 12 to the bias control terminals of amplifiers 14 to 18, which terminals may usually include the bases of NPN transistors therein. By changing the waveform control signal c, the combined gain of the amplifiers 14 to 18 can be controlled between zero to its maximum. When no control signals are applied to the control terminals 12 and 13, or the voltages of control the signals c and f are zero, the power amplifier 1 is inactivated.

The power amplifier 1 may have another control terminal 19 connected to the power source terminals (the collectors of the NPN transistors) of the third- through fifth-stage amplifiers 16 through 18. By applying to the terminal 19 a control signal similar to the level or waveform control signal f or c, the level or waveform of the output burst signal e may further be controlled.

In FIG. 4, the ALC circuit 2 has the directional coupler 21 composed of a main line 211 and sub-line 212 which may comprise a coaxial line, a strip line or the like. An output burst signal propagates over the main line 211 and reaches the output terminal 5. The main line 211 is electromagnetically coupled to the sub-line 212 whose one end is terminated by a matching resistor 213, and the burst signal is partly supplied to the detector 22 via the sub-line 212.

The detector 22 includes a diode 221 to detect the supplied burst signal. A capacitor 222 is connected between the sub-line 212 and the anode of diode 221 to block D.C. coupling therebetween A resistor 223 is connected between the anode of diode 221 and ground, and a resistor 224, between the cathode of diode 221 and a negative power source terminal 225, to constitute a bias circuit and a load resistance, respectively, for the diode 221. When a burst signal is supplied to the detector 22, the rectifying operation of the diode 221 causes the potential of the cathode of the diode 221, i.e., a detection signal representing the level of output burst signal e emerging at the output terminal 226 of the detector 22, to increase in the negative direction.

The detection signal is supplied to the inverting terminal of differential amplifier 23 to whose non-inverting terminal the reference voltage d (or g) is supplied. The amplifier 23 increases the voltage thereof, i.e., the voltage of level control signal f when the reference voltage d is higher than the level of the detection signal, while decreasing the same when the level of the detection signal increases in proportion to that of output burst signal e and surpasses the reference voltage d. Thus, an increase in the output level of the power amplifier 1 causes the level of level control signal f to decrease and, therefore, the power amplifier 1 and the ALC circuit 2 constitute negative feedback ALC loop.

In FIG. 5, the waveform control circuit 3 has a diode 32 whose anode is connected to the terminal 6 and a diode 35 whose cathode is also connected to the terminal 6. To the cathode of diode 32 is connected the drain D of an MOS transistor 33. The gate G of MOS transistor 33 is connected directly, and its source S, via a variable resistor 34, to the output terminal 31. The intermediate terminal of variable resistor 34 is also connected to the output terminal 31. The anode of diode 35 is connected to the source S of an MOS transistor 37 via a variable resistor 36. The gate G of MOS transistor 37 is connected to the intermediate terminal of variable resistor 36, and its drain D, to the output terminal 31. Between the output terminal 31 and ground is connected a capacitor 38. To the output terminal 31 is connected the control terminal 12 (FIG. 1) of power amplifier 1.

In operation, the burst timing signal b (FIG. 2B) is applied to the diode 35 through the terminal 6 to inactivate the diode 35 at the leading edge of the signal b, so that the diode 35 and the MOS transistor 37 are inactivated. At the same time, the diode 32 is rendered active and thus the MOS transistor 33 is self-biased by the variable resistor 34, so that the diode 32, the MOS transistor 33 and the variable resistor 34 constitute a constant current circuit. The current flowing through the diode 32 charges the capacitor 38 at a linear inclination to the voltage Vw, which is somewhat lower than the voltage of the burst timing signal b. This charging time is determined by the value of the flowing current and the capacity of capacitor 38. The current charging the capacitor 38 can be varied by adjusting the resistance of variable resistor 34, which determines the bias voltage for the MOS transistor 33.

After the voltage of the capacitor 38, i.e., that of the waveform control signal c, has risen to Vw, this state will stay on until the burst timing signal b falls. When the burst timing signal b begins to fall, the reverse voltage is applied to the diode 32, so that the diode 32 and the MOS transistor 33 are inactivated. Meanwhile, a forward voltage is applied to the diode 35, and thus the diode 35 and the MOS transistor 37 are activated. Since the MOS transistor 37 is self-biased by the variable resistor 36 at this time, the diode 35, the variable resistor 36 and the MOS transistor 37 constitute a constant current circuit. The current flowing through the diode 35 discharges the capacitor 38 at a linear inclination to almost zero volts. The discharging time is also determined by the value of the flowing current and the capacity of the capacitor 38. The current discharging the capacitor 38 can be varied by adjusting the resistance of variable resistor 36, which determines the bias voltage for the MOS transistor 37.

In this way, the waveform control circuit 3 can determine as desired the rise and fall times of the waveform control signal c. It can be readily understood that since the waveform control signal c, which is a principal control signal to determine the leading and trailing edges of the output burst signal e, is generated only by the waveform control circuit 3, which handles only a baseband signal, the circuit configuration is simplified.

In FIG. 6, the second preferred embodiment of the present invention has a level limiting circuit 8 connected to the control terminal 13 of power amplifier 1, in addition to the circuits of the first preferred embodiment shown in FIG. 1. The level limiting circuit 8 includes a differential amplifier 61 whose inverting and non-inverting terminals are respectively connected to one end of a resistor 83 and to the positive terminal (voltage V2) of a reference voltage source 82 whose output voltage can be varied. The other end of resistor 83 is connected to the output terminal 25 of ALC circuit 2, i.e., to the control terminal 13 of power amplifier 1. The anode of a diode 84 is connected to the other end of resistor 83, and its cathode, to the output end of differential amplifier 81.

In operation, the voltage at the output terminal 25 is fed back to the inverting terminal of differential amplifier 81 via the resistor 83. If the voltage of level control signal f supplied from the terminal 25 surpasses the reference voltage V2, the output voltage of differential amplifier 61 will fall because the voltage of the signal f is fed back to the inverting terminal. As a result, the diode 84 is rendered conductive, and thus the voltage of the level control signal f falls to a level somewhat higher than the reference voltage V2. In this manner, the maximum input voltage to the control terminal 13 of power amplifier 1 is limited to a level set by the reference voltage V2. Therefore, the level of the output burst signal e is restricted not to exceed a certain value.

This is effective in preventing overshooting, which may otherwise occur at the leading and trailing edges of the output burst signal e, especially for the time lag caused in the ALC loop including the power amplifier 1 and the ALC circuit 2.

What is claimed is:

1. A burst control circuit for use in a TDMA communications system, comprising:
   power amplifier means having first and second control terminals for amplifying an input burst signal to produce an output burst signal, said amplifier means changing the level and waveform of said output burst signal in response to level and waveform control signals which are supplied through said first and second terminals, respectively;
   ALC circuit means for generating a level control signal on the basis of a signal representing a difference between a first reference voltage and the level of said output burst signal, and supplying the generated level control signal to said first control terminal as said level control signal; and
   waveform control circuit means for generating a waveform control signal in response to a burst timing signal, and supplying the generated waveform control signal to said second control terminal as said waveform control signal.

2. A burst control circuit as claimed in claim 1, wherein said power amplifier means and said ALC circuit means constitute a negative feedback circuit.

3. A burst control circuit as claimed in claim 1, wherein said power amplifier means is activated by said level control signal while said input burst signal is supplied.

4. A burst control circuit as claimed in claim 1, wherein the rise and fall times of said waveform control signal are set to be longer than those of said input burst signal.

5. A burst control circuit as claimed in claim 1, wherein said first reference voltage is applied to said ALC circuit means for a substantially equal duration to the period during which said input burst signal is supplied to said power amplifier means.

6. A burst control circuit as claimed in claim 5, wherein the rise and fall times of said first reference voltage are set to be substantially equal to those of said waveform control signal.

7. A burst control circuit as claimed in claim 1, further comprising level limiting circuit means for limiting the level of said level control signal to a predetermined level.

8. A burst control circuit as claimed in claim 1, wherein said power amplifier means comprises a plurality of amplifiers connected in cascade, said first control terminal being connected to the voltage source terminals of at least two of said amplifiers and said second control terminal being connected to the base control terminals of said plurality of amplifiers.

9. A burst control circuit as claimed in claim 1, wherein said ALC circuit means comprises a directional coupler for taking out part of said output burst signal; a detector for detecting the taken-out burst signal to produce a detected level of said output burst signal; and a differential amplifier whose two inputs are supplied with said first reference voltage and the detected level of said output burst signal, respectively, and whose output is connected to said first control terminal.

10. A burst control circuit as claimed in claim 1, wherein said waveform control circuit means comprises means for generating said waveform control signal to raise at an inclination the level of said output burst signal when said input burst signal is rising and to lower at an inclination the level of said output burst signal when said input burst signal is falling.

11. A burst control circuit as claimed in claim 1, wherein said waveform control circuit means comprises:
   an input terminal for receiving said burst timing signal;
   an output terminal connected to said second control terminal;
   a first diode whose anode is connected to said input terminal;
   a first MOS transistor whose drain is connected to the cathode of said first diode;
   a first variable resistor of which one end is connected to the source of said first MOS transistor, and the other end and an intermediate end are connected to the gate of said first MOS transistor and to said output terminal;
   a second diode whose cathode is connected to said input terminal;
   a second variable resistor one end of which is connected to the anode of said second diode;
   a second MOS transistor whose source gate and drain are connected to the other end of said second variable resistor, to the intermediate end of said second variable resistor and to said output terminal, respectively; and
   a capacitor connected between said output terminal and ground.

12. A burst control circuit as claimed in claim 7, wherein said level limiting circuit means comprises:
   a reference voltage source for generating a second reference voltage;
   a differential amplifier to one of whose two inputs is connected said reference voltage source;
   a diode whose anode and cathode are connected to said first control terminal and to the output end of said differential amplifier, respectively; and
   a resistor connected between the other input of said differential amplifier and the anode of said diode.

13. A burst control circuit comprising:
   amplifier means for amplifying an input burst signal and controlling the level of the amplified burst signal in accordance with level and waveform control signals;
   means for detecting said amplified burst signal to produce a detected burst signal;
   means for comparing the level of said detected burst signal with a first reference voltage to produce a difference signal;
   feedback means for supplying said difference signal to said amplifier means as said level control signal to provide said amplifier means with negative feedback control; and
   waveform control circuit means responsive to a burst timing signal for generating a control signal having gently sloped leading and trailing edges and supplying said control signal to said amplifier means as said waveform control signal.

14. A burst control circuit as claimed in claim 13, wherein said waveform control circuit means comprises:
   a first diode to whose anode is supplied said burst timing signal;

a first MOS transistor whose drain is connected to the cathode of said first diode;

a first variable resistor of which one end is connected to the source of said first MOS transistor, and the other end and the intermediate end are connected to the gate of said first MOS transistor and to the output of said waveform control circuit means;

a second diode to whose cathode is supplied said burst timing signal;

a second variable resistor one end of which is connected to the anode of said second diode;

a second MOS transistor whose source, gain and drain are connected to the other end of said second variable resistor, to the intermediate end of said second variable resistor and to the output of said waveform control circuit means, respectively; and a capacitor connected between the output of said waveform control circuit means and ground.

15. A burst control circuit as claimed in claim 13, further comprising level limiting circuit means for limiting the level of said level control signal to a predetermined level.

16. A burst control circuit as claimed in claim 15, wherein said level limiting circuit means comprising:

a reference voltage source for generating a second reference voltage;

a differential amplifier to one of whose two inputs is connected said reference voltage source;

a diode whose anode and cathode are connected to the output of said feedback means and to the output of said differential amplifier, respectively; and a resistor connected between the other input of said differential amplifier and the anode of said diode.

17. A burst control circuit as claimed in claim 13, wherein said amplifier means is activated by said level control signal while said input burst signal is supplied.

18. A burst control circuit as claimed in claim 13, wherein the rise and fall times of said waveform control signal are set to be longer than those of said input burst signal.

19. A burst control circuit as claimed in claim 13, wherein said first reference voltage is applied to said comparing means for a substantially equal duration to the period during which said input burst signal is supplied to said amplifier means.

20. A burst control circuit as claimed in claim 19, wherein the rise and fall times of said first reference voltage are set to be substantially equal to those of said waveform control signal.

* * * * *